US008441747B2

(12) United States Patent
Heintel et al.

(10) Patent No.: US 8,441,747 B2
(45) Date of Patent: May 14, 2013

(54) OPTICAL MODULE WITH MINIMIZED OVERRUN OF THE OPTICAL ELEMENT

(75) Inventors: Willi Heintel, Aalen (DE); Hagen Federau, Augsburg (DE); Joachim Hartjes, Aalen (DE); Harald Kirchner, Munich (DE); Bernhard Geuppert, Aalen (DE); Ulrich Bingel, Michelfeld (DE); Tilman Schwertner, Aalen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 802 days.

(21) Appl. No.: 11/901,130

(22) Filed: Sep. 14, 2007

(65) Prior Publication Data

US 2008/0204689 A1    Aug. 28, 2008

Related U.S. Application Data

(60) Provisional application No. 60/844,507, filed on Sep. 14, 2006.

(30) Foreign Application Priority Data

Sep. 14, 2006   (DE) .......................... 10 2006 044 033

(51) Int. Cl.
*G02B 7/02*   (2006.01)
*G03B 27/42*  (2006.01)

(52) U.S. Cl.
USPC .............................. 359/819; 359/830; 355/53

(58) Field of Classification Search .................. 359/819, 359/820, 822, 813, 830; 355/53
See application file for complete search history.

(56) References Cited

U.S. PATENT DOCUMENTS

| 4,733,945 | A  |   | 3/1988  | Bacich |
|-----------|----|---|---------|--------|
| 5,428,482 | A  | * | 6/1995  | Bruning et al. ............... 359/827 |
| 6,229,657 | B1 | * | 5/2001  | Holderer et al. .............. 359/822 |
| 6,825,998 | B2 |   | 11/2004 | Yoshida |
| 7,006,308 | B2 |   | 2/2006  | Sudoh |
| 2002/0163741 | A1 | * | 11/2002 | Shibazaki ..................... 359/819 |

FOREIGN PATENT DOCUMENTS

| DE | 19735831 | 2/1999 |
| DE | 19825716 | 12/1999 |
| DE | 10030495 | 1/2002 |
| DE | 10053899 | 5/2002 |
| DE | 10115914 | 10/2002 |
| WO | WO 2004/086148 | 10/2004 |
| WO | WO 2005101131 A1 * | 10/2005 |

OTHER PUBLICATIONS

Kowalskie, "A User's Guide to Designing and mounting Lenses and Mirrors," Lawrence Livermore Laboratory, UCRL-52411 (41 pages), Feb. 17, 1978.
International Standard, ISO 10110-1, second edition (32 pages), Jul. 1, 2006.

* cited by examiner

*Primary Examiner* — Steven H Whitesell Gordon
(74) *Attorney, Agent, or Firm* — Fish & Richardson P.C.

(57) ABSTRACT

There is provided an optical module for microlithography. The optical module includes an optical element and a retaining device for holding the optical element. The optical element has (a) a main extension plane, in which it defines a radial direction R and a circumferential direction U, and (b) a free optical diameter and an overrun in the region of its outer periphery. The retaining device contacts the optical element in the region of the overrun, and is formed and/or contacts the optical element in such a manner that the overrun ratio, calculated from the overrun related to a minimum overrun necessary for the production of the optical element, is at most 1.5.

15 Claims, 7 Drawing Sheets

OPTICAL MODULE WITH MINIMIZED OVERRUN OF THE OPTICAL ELEMENT

BACKGROUND OF THE INVENTION

The present invention relates to an optical module, an optical imaging device comprising such an optical module as well as to a method for holding an optical element. The invention can be employed in connection with microlithography used in the production of microelectronic circuits. It also relates to an optical imaging method, which can be carried out inter alia with the optical imaging device according to the invention.

Particularly in the field of microlithography, apart from the use of components made with the highest possible precision, it is necessary inter alia to maintain the position and geometry of the components of the imaging device, thus for example the optical elements such as lenses, mirrors or grids, unchanged as far as possible during operation, in order to achieve correspondingly high reproduction quality. The high precision demands, which lie in the microscopic range in the order of magnitude of a few nanometres or below, are in this case not least a consequence of the constant need to increase the resolution of the optical systems used in the production of microelectronic circuits, in order to promote the miniaturization of the microelectronic circuits to be produced.

In order to obtain higher resolution, either the wavelength of the light used can be reduced, as is the case in systems, which work within the extreme UV range (EUV) with working wavelengths in the range of 13 nm, or the numeric aperture of the projection system can be increased. A significant increase of the numeric aperture above the value One is possible with so-called immersion systems, in which an immersion medium, whose refractive index is greater than One is provided between the last optical element of the projection system and the substrate to be exposed. A further increase of the numeric aperture is possible with optical elements having a particularly high refractive index.

Both with the reduction of the working wavelength and with the increase of the numeric aperture, not only the demands for positioning accuracy and dimensional stability of the optical elements used throughout their entire operation, increase. Also of course the demands regarding minimization of the imaging errors of the total optical arrangement increase.

Of special importance here is the intrinsic weight of the optical elements used. The lower this proves to be, on the one hand the higher the attainable resonant frequency of the arrangement consisting of the optical element and its retaining structure. Thus oscillations of the arrangement caused by mechanical disturbances and imaging errors resulting therefrom can be reduced. On the other hand, with the intrinsic weight, naturally the deformation of the optical elements caused by the intrinsic weight and the aberrations resulting therefrom, also reduce.

In the field of microlithography lenses are frequently supported by means of a plurality of spring elements, which are evenly arranged on the periphery of the respective lens and contact one of the optical surfaces of the lens in the area of the so-called overrun of the lens, that is to say, in the boundary region of the lens outside the free optical diameter of the lens. The lens in this case either lies from above on top of the spring elements or is attached from below to the spring elements. At the same time it is usually adhesively bonded with the spring elements. The spring elements, in the radial direction of the lens, are usually constructed to be as compliant as possible in order to prevent stresses—for example caused by different thermal expansion of the lens and the supporting structure—being introduced by means of the supporting structure into the lens, which might lead to imaging errors.

Although due to such a configuration as even support as possible of the weight of the lens is achieved, it has the disadvantage that for the contact zone between the spring elements and the lens in the radial direction of the lens outside its free optical diameter, a comparatively large boundary region and thus a comparatively large overrun are necessary. In other words as a result the diameter of the lens substantially increases beyond the actual dimension necessary to fulfil the optical function. Herewith, naturally, the intrinsic weight of the lens also increases.

From U.S. Pat. No. 4,733,945 (Bacich)—the disclosure of which is herewith incorporated by reference—it is also known, inter alia, to hold a lens in the radial direction by means of compliant spring elements, which are adhesively bonded with the cylindrical border of the lens. The spring elements in this case run in the circumferential direction of the lens, so that—due to the length of the spring elements in the circumferential direction—only a very limited number of spring elements can be arranged on the periphery of the lens. This has the disadvantage that, on account of the comparatively small number of spring elements, a comparatively large adhesive surface is needed for each spring element, in order to be able to support the intrinsic weight of the lens and the dynamic loads arising thereon.

Such comparatively large adhesive surfaces in turn have the disadvantage that, on the one hand, due to possible shrinkage of the adhesive, substantial stresses are introduced into the lens in a concentrated way. On the other hand the large adhesive surfaces also require a comparatively high dimension of the cylindrical border, transverse to the main extension plane of the lens, that is to say, in the direction of the optical axis of the lens. The lens must therefore be made correspondingly thick, as a result of which its overrun and thus its intrinsic weight in turn substantially increase beyond the optically required dimension.

BRIEF SUMMARY OF THE INVENTION

The object of the present invention is therefore to provide an optical module, an optical imaging device and a method for holding an optical element, which do not or at least to a lesser degree, have the disadvantages mentioned above and, in particular, in a simple manner permit a reduction in the intrinsic weight of the optical element.

The present invention is based on the finding that such a reduction in the intrinsic weight of the lens is possible, if the lens is held in such a way that the overrun ratio calculated from the overrun of the optical element related to a minimum overrun necessary for the production of the optical element, is at most 1.5. It has been shown that it is possible, by means of suitable measures when holding the lens, to substantially reduce the overrun of the optical element so that in this case a corresponding weight reduction of the lens can be achieved with the advantages, already described at the beginning, regarding the resonant frequency and deformation of the optical element caused by the intrinsic weight.

It is eventually even possible, in accordance with the invention, to be able to limit the overrun to the minimum overrun required by the production process of the optical element, so that the intrinsic weight of the optical element can be reduced to a minimum.

An object of the present invention is therefore an optical module, particularly for microlithography, having an optical element and a retaining device for holding the optical element. The optical element has a main extension plane, in which it defines a radial direction R and a circumferential direction U. Furthermore the optical element has a free optical diameter and an overrun in the vicinity of its outer periphery. The retaining device contacts the optical element in the region of the overrun. The retaining device is also designed and/or contacts the optical element in such a manner that the overrun ratio calculated from the overrun, related to a minimum overrun necessary for the production of the optical element, is at most 1.5.

A further object of the present invention is an optical module, particularly for microlithography, having an optical element and a retaining device for holding the optical element. The optical element has a main extension plane, in which it defines a radial direction R and a circumferential direction U and furthermore the optical element in the vicinity of its periphery has a contact surface, which extends substantially perpendicularly to the main extension plane of the optical element. The retaining device has a plurality of contact elements, which are designed to be resilient in the radial direction R, and which contact the optical element in the region of the contact surface, wherein at least one of the contact elements has a spring section, which is formed in the manner of a leaf spring resilient in the radial direction R. The spring section in turn has a bending axis, which runs substantially tangentially to the circumferential direction U.

Due to the tangential alignment of the bending axis of the spring section, it is possible in an advantageous way to distribute a large number of spring elements on the periphery of the optical element, as a result of which the contact zone of the respective contact element with the optical element and thus the necessary overrun of the optical element can be reduced. This also has the advantage that, if the contact elements are bonded with the optical element, eventual stresses due to contraction of the adhesive, locally introduced into the optical element are reduced.

A further object of the present invention is an optical module, particularly for microlithography, having an optical element and a retaining device for holding the optical element. The optical element has a main extension plane, in which it defines a radial direction R and a circumferential direction U. The optical element on its outer periphery has a contact surface, via which the retaining device is connected to the optical element. The retaining device, at least section wise, is connected to the optical element by at least one contact element, galvanically deposited on the contact surface.

This configuration has the advantage that, due to the contact element being produced by galvanic deposition, only a very small overrun of the optical element, possibly even only the minimum overrun required for production of the optical element, is necessary in order to hold the optical element. As a result the use of especially light optical elements, and the advantages associated therewith, can be achieved.

A further object of the present invention is an optical imaging device, particularly for microlithography, having an illumination device, a mask device for receiving a mask comprising a projection pattern, a projection device with an optical element group and a substrate device for receiving a substrate, wherein the illumination device is designed to illuminate the projection pattern and the optical element group is designed to image the projection pattern on the substrate. The illumination device and/or the projection device according to the invention comprise at least one optical module according to any one of the preceding claims.

With this optical imaging device the variants and advantages described above can be achieved to the same degree, so that in this connection reference is made to the above details.

A further object of the present invention is a method for holding an optical element, in particular an optical element for microlithography, wherein the optical element is held by means of a retaining device, wherein the optical element has a main extension plane, in which it defines a radial direction R and a circumferential direction U, and the optical element has a free optical diameter and an overrun in the vicinity of its outer periphery and the retaining device holds the optical element in the region of the overrun. The optical element is held in such a manner that the overrun ratio calculated from the overrun, related to a minimum overrun necessary for the production of the optical element, is at most 1.5.

A further object of the present invention is a method for holding an optical element, in particular an optical element for microlithography, wherein the optical element is held by means of a retaining device, wherein the optical element has a main extension plane, in which it defines a radial direction R and a circumferential direction U, the optical element in the vicinity of its periphery has a contact surface, which extends substantially perpendicularly to the main extension plane of the optical element, the retaining device has a plurality of contact elements, which are designed to be resilient in the radial direction R and contact the optical element in the region of the contact surface. At least one of the contact elements has a spring section, which is formed in the manner of a leaf spring, which is resilient in the radial direction R. The spring section in turn has a bending axis, which runs substantially tangentially to the circumferential direction U.

A further object of the present invention is a method for holding an optical element, in particular an optical element for microlithography, wherein the optical element is held by means of a retaining device. The optical element in this case is held by at least one contact element, galvanically deposited on the optical element.

Further preferred arrangements of the invention will become apparent from the dependent claims and the following description of preferred embodiments, which refers to the appended drawings.

DETAILED DESCRIPTION OF THE INVENTION

First Embodiment

Figure 1:
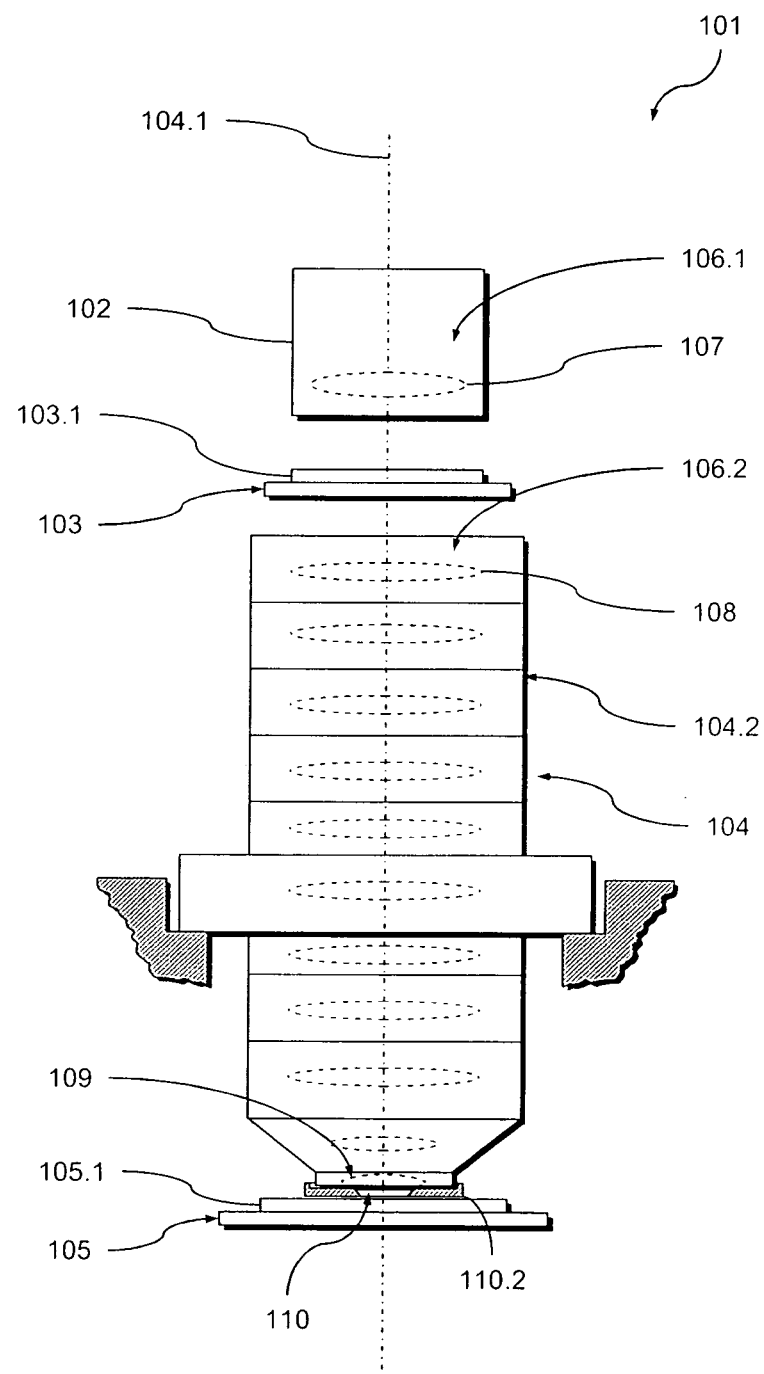
FIG. 1 is a schematic illustration of a preferred embodiment of the optical imaging device according to the invention, which comprises an optical module according to the invention and with which a preferred embodiment of the optical imaging method according to the invention can be performed.
Figure 2:
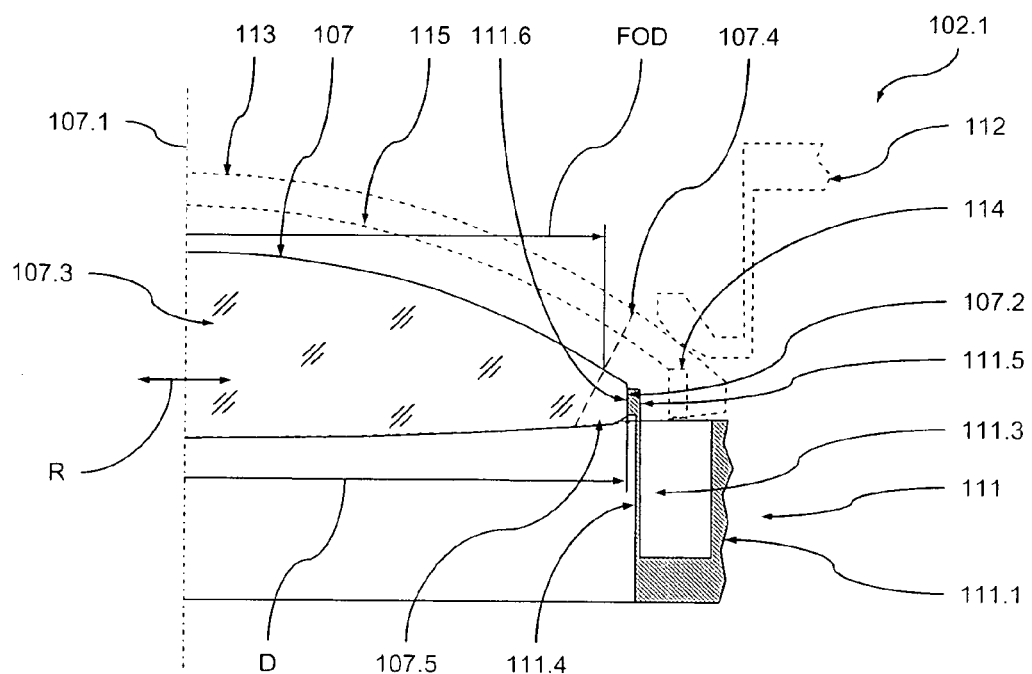
FIG. 2 is a schematic partial section through an optical module according to the invention of the imaging device from FIG. 1.
Figure 3:
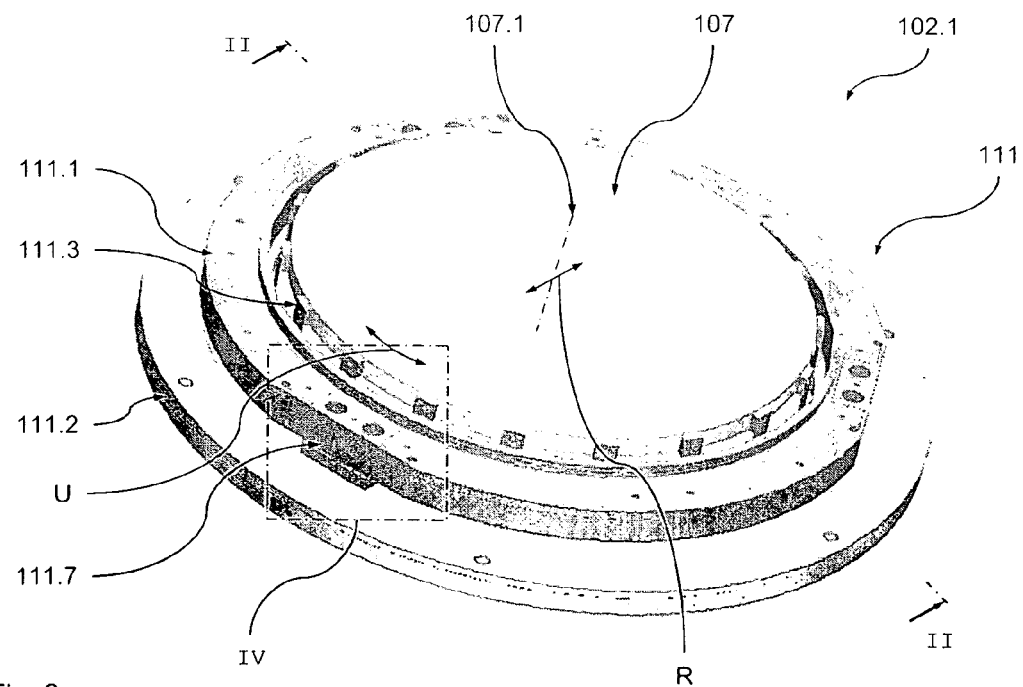
FIG. 3 is a schematic perspective view of the optical module from FIG. 2.
Figure 4:
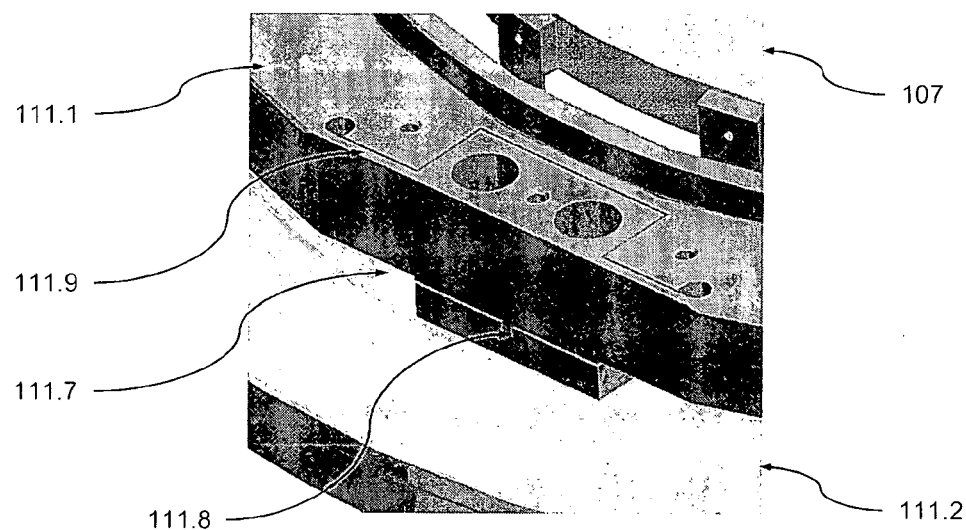
FIG. 4 is a schematic perspective view of detail IV of the optical module of FIG. 3.

With reference to FIGS. 1 to 3 a preferred embodiment of the optical module according to the invention, which is used in an optical imaging device according to the invention for microlithography, is described below.

FIG. 1 shows a schematic illustration of a preferred embodiment of the optical imaging device according to the invention in the form of a microlithography device 101, which works with light within the UV range at a wavelength of 193 nm.

The microlithography device 101 comprises an illumination system 102, a mask device in the form of a mask table 103, an optical projection system in the form of an objective 104 with an optical axis 104.1 and a substrate device in the form of a wafer table 105. The illumination system 102 illuminates a mask 103.1 placed on the mask table 103 with a—not illustrated in detail—projection light beam of the wavelength 193 nm. On the mask 104.1 is a projection pattern, which is projected with the projection light beam, by means of the optical elements arranged in the objective 104, onto a substrate in the form of a wafer 105.1, which is placed on the wafer table 105.

The illumination system 102 apart from a—not illustrated light source—comprises a first optical element group 106.1, which includes inter alia an optical element 107. On account of the working wavelength of 193 nm, the optical element 107 is a refractive optical element, that is to say, a lens or the like.

The objective 104 comprises a second optical element group 106.2, which is formed by a set of optical elements 108 to 109. The optical elements 108 to 109 are held in the housing 104.2 of the objective 104. On account of the working wavelength of 193 nm, the optical elements 108 to 109 are refractive optical elements, that is to say, lenses or the like. In this case the last optical element 109, which lies closest to the wafer 105.1 during operation, is a so-called closing element or last lens element.

The microlithography device 101 is an immersion system. In this case a liquid immersion medium 110.1, for example highly purified water or the like, is provided between the wafer 105.1 and the last lens element 109 in an immersion zone 110. In this case an immersion bath containing the immersion medium 110.1, which on the one hand is delimited downwards at least by the part of the wafer 105.1 actually to be exposed, is present in the immersion zone 110. The lateral delimitation of the immersion bath is effected at least partly by an immersion frame 110.2. At least the part of the last lens component 109, optically used during exposure and lying on the outside of the objective 104, is immersed in the immersion bath. Therefore the path of the light emerging during exposure from the last lens element 109, between the last lens element 109 and the wafer, runs exclusively in the immersion medium 110.1.

As a result of the refractive index of the immersion medium lying above the value One, a numeric aperture of NA>1 is achieved and therefore the resolution is increased compared to a conventional system, wherein a gas atmosphere is present between the last lens element and the wafer 105.1.

FIGS. 2 and 3 show a schematic section and a perspective view of an optical module 102.1, comprising the lens 107, of the illumination system 102. FIG. 2 here is a partial section along line II-II from FIG. 3. As may be seen from these figures, this optical module 102.1 according to the invention, beside the lens 107, comprises a retaining device 111, by means of which the lens 107 is held.

The retaining device 111 for this purpose comprises a circular retaining element, in the form of an inner ring 111.1, carrying the lens 107, which in turn is supported on a circular retaining structure in the form of an outer ring 111.2. The outer ring 111.2 is attached—not illustrated in FIGS. 2 and 3—to the housing of the illumination system 102 or forms part of this housing, respectively.

As may be seen from FIGS. 2 and 3, the inner ring 111.1 is connected to the lens 107 by a plurality of contact elements 111.3. The contact elements 111.3 are formed as leaf spring elements being narrow in the circumferential direction U of the lens 107 and having an elongated spring section 111.4.

The contact elements 111.3 in the present example are monolithically connected to the inner ring 111.1. It goes without saying however that with other variants of the invention, it can also be provided that the contact elements are implemented combined altogether or in groups or individually as a separate structural unit, which is connected to the inner ring.

The contact elements 111.3 extend substantially parallel to the optical axis 107.1 of the lens 107 and perpendicularly to the main extension plane of the lens 107. The spring section 111.4 thus defines a bending axis, which is aligned substantially tangentially to the circumferential direction U of the lens 107.

The contact elements 111.3, at their end facing the lens 107, have a contact head 111.5, which contacts a first contact surface 107.2 of the lens 107 with a second contact surface 111.6. The first contact surface 107.2 runs perpendicularly to the main extension plane of the lens 107 and thus parallel to the optical axis 107.1. Consequently the first contact surface 107.2 thus runs along the so-called cylinder of the lens 107.

The first contact area 107.2 in the present example extends over the entire extent of the lens 107. It goes without saying however that with other variants of the invention, it can be also provided that the first contact area is only provided in one or more peripheral sections of the lens.

The contact heads 111.5 are adhesively bonded to the lens 107 by a suitable adhesive. It goes without saying however that with other variants of the invention, it can also be proposed that another arbitrary connection, which produces a corresponding adhesive force is selected between the contact head and the lens.

As may be seen from FIG. 3, the number of contact elements 111.3 is selected in such a manner that the contact zone of the contact elements 111.3 with the lens 107 in total extends over approximately 25% of the circumference of the lens 107, therefore over more than 20% of the circumference of the lens 107. As a result of the alignment of the contact elements 111.3, described above, in particular the alignment of the bending axis of the spring sections 111.4, on the one hand it is possible, with sufficient rigidity in the other spatial directions, to achieve, in the radial direction R, a particularly compliant and thus advantageous connection of the lens 107 with the retaining device 111.

Owing to the comparatively large number of contact elements 111.3 and the wide contact zone achieved in total or the resultant coverage of the lens periphery or of the first contact area 107.2 in the circumferential direction U, respectively, achieved thereby, it is therefore possible to keep the dimension of the contact heads 111.5 in the direction of the optical axis 107.1 small.

This has the advantage on the one hand that stresses, due to changes taking place over time in the adhesive used (for example shrinkage, ageing etc.) and introduced into the lens 107 on account of the small contact zone or adhesive surface for each contact element 111.3, are particularly low, therefore die out over a comparatively short distance in the lens 107 and thus normally do not propagate into the optically used or usable region 107.3 of the lens 107.

The optically usable region 107.3 of the lens 107 is defined—usually indicated in the data sheet of a lens—by the so-called free optical diameter FOD or mathematical free diameter of the lens 107. The free optical diameter FOD of the lens 107 is the largest diameter, which is defined by the outermost rays of a light beam still completely penetrating the lens 107, as indicated in FIG. 2 by the broken line 107.4, when passing through one of the lens surfaces of the lens 107.

The circular boundary region 107.5 of the lens 107, lying outside the optically usable area 107.3 is usually designated the overrun of the lens 107. A measure for the overrun S is the difference between the diameter D of the cylindrical lens circumference 107.2 and the free optical diameter FOD, normally increased by a safety margin C, that is to say:

$$S=D-(FOD+C), \quad (1)$$

where safety margin C usually amounts to about 0.5 mm.

Owing to the small size of the contact heads 111.5 in the direction of the optical axis 107.1, it is also possible to keep the size of the first contact surface 107.2 in the direction of the optical axis 107.1 and therefore the overrun 107.5 of the lens 107 as well as the volume of the lens 107 low.

As may be seen from FIG. 2, a particularly compact lens 107 can therefore be obtained with the present invention. This applies in particular compared with the prior art mounting techniques, which are indicated in FIG. 2 by the broken outlines 112 and 113 or 114 and 115, respectively. With the prior art mounting techniques, wherein the contact elements 112 are bonded to an optical surface 113 of the lens, on account of the contacts around the optical surface, a large overrun and thus a large lens size result. In the case of prior art mounting techniques, wherein the contact elements 114 are arranged on leaf springs running in the circumferential direction of the lens and bonded to the cylinder of the lens 115, the large overrun is due inter alia to the large adhesive surface for each contact element 114 and thus the comparatively long distance to the optically usable region of the lens 115, required for relieving the adhesive stresses.

This lens size, reduced in relation to the prior art methods, on the one hand has the economic advantage that less lens material is needed. On the other hand naturally the intrinsic weight of the lens is reduced with the advantages, already described at the beginning, regarding the increased resonant frequency of the arrangement consisting of retaining device 111 and lens 107 and the reduced inherent deformation of the lens 107 as well as the advantages resulting therefrom regarding the reduction of imaging errors. In particular it is possible to achieve a favourable resonant frequency of the arrangement consisting of retaining device 111 and lens 107 above 300 Hz.

In the present example it is possible, owing to the present invention, to limit the overrun 107.5 of the lens 107 to the minimum dimension required for the production of the lens 107.

For each lens a certain minimum overrun, in whose range the lens must be maintained inter alia during the making of its optical surfaces, is necessary for production. Depending upon production method, nominal diameter and type of lens, various minimum overruns are necessary. Thus in the case of an aspherical lens with a nominal diameter of approximately 200 mm usually a minimum overrun, which lies approximately between 10 mm and 12 mm is necessary, while this minimum overrun in the case of a spherical lens of this nominal diameter usually lies approximately between 4 mm and 6 mm.

If an overrun ratio $S_{rel}$ is defined as the quotient calculated from the actual overrun S and the minimum overrun $S_{min}$ required for production, the following applies:

$$S_{rel} = \frac{S}{S_{min}}. \quad (2)$$

In the present example therefore where $S=S_{min}$ an overrun ratio $S_{rel}=1$ applies. It goes without saying however that with the other variants of the invention, if necessary a somewhat larger overrun can also be provided. In any case with the present invention an overrun ratio $S_{rel} \leq 1.5$ is attainable, wherein normally an overrun ratio $S_{rel} \leq 1.2$ can be achieved.

In order to reduce, to the greatest extent possible, stresses due to different thermal expansion of the lens 107 and the inner ring 111.1, for the inner ring 111.1 a material is preferably used, whose coefficient of thermal expansion is adapted to the coefficient of thermal expansion of the lens 107. In the present example the lens 107 is made of quartz ($SiO_2$) and the inner ring 111.1 is made of Invar. It goes without saying however that with other variants of the invention other arbitrary materials, correspondingly adapted to one another, can be used. Thus for example a lens made of calcium fluoride ($CaF_2$) can be combined with an inner ring made of certain stainless steel or brass etc.

The inner ring 111.1 is connected to the outer ring 111.2 by means of three uncoupling elements 111.7 evenly distributed on its periphery. The uncoupling elements 111.7 serve to prevent, to the greatest extent possible, stresses being introduced from the outer ring 111.2 into the inner ring 111.1 and via the latter into the lens 107. Such tensions can be due inter alia to temperature gradients in the system, different coefficients of thermal expansion, production irregularities at joining faces, joining forces or joining moments etc.

The uncoupling elements 111.7 in each case restrict two degrees of freedom, that is to say, in the present example the degree of freedom in the direction of the optical axis 107.1 as well as the degree of freedom tangential to the circumferential direction U. As a result a so-called isostatic mounting of the inner ring 111.1 is achieved. It goes without saying however that with other variants of the invention, different degrees of freedom can also be restricted in pairs.

The uncoupling elements 111.7 are monolithically connected to the inner ring 111.1 in the present example. To this end, for example, using wire erosion corresponding cuts are formed in the inner ring 111.1 via which corresponding elastic hinges 111.8 and leaf spring elements 111.9 are formed, via which the articulated connection of the inner ring 111.1 to the outer ring 111.2 is provided under the restriction in the two degrees of freedom.

It goes without saying however that with other variants of the invention, a monolithic connection between the outer ring and the uncoupling element can also be provided. Likewise it can be provided that the uncoupling elements are implemented totally or partly as separate structural units. Likewise it goes without saying that, with other variants of the invention, with a larger number of uncoupling elements, also an isostatic support may be achieved with uncoupling elements at least in part restricting only one degree of freedom.

The optical module 102.1 in the present example is a module of the illumination system 102, in which during operation of the imaging device 101 variations in temperature of for instance ±10 K are permissible. With the present configuration of the optical module according to the invention, it is possible even with these comparatively wide variations in temperature to maintain the stress induced birefringence below 2 nm/cm and in particular to limit this to the boundary region of the lens 107.

It goes without saying in this case that the configuration of the optical module 102.1, described above, can equally also be used for an optical module of the objective 104. For example at least one of the lenses 108 of the objective 104 can be held by the retaining device 111 described above.

Second Embodiment

Figure 5:
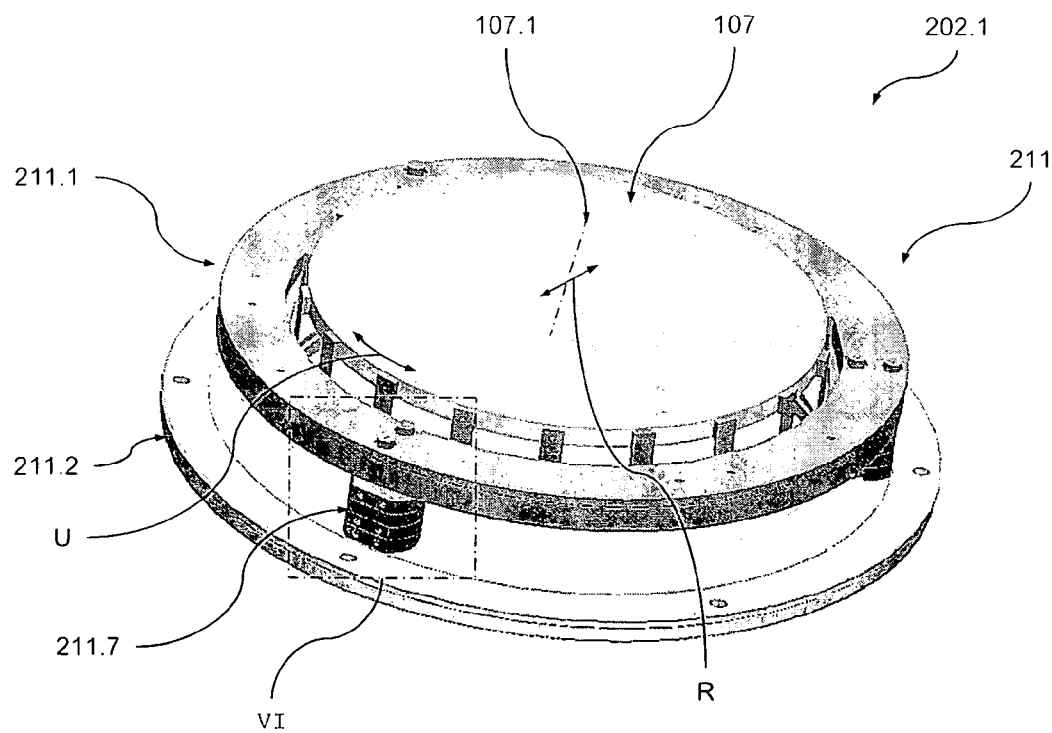
FIG. 5 is a schematic perspective view of a further optical module according to the invention for the imaging device from FIG. 1.
Figure 6:
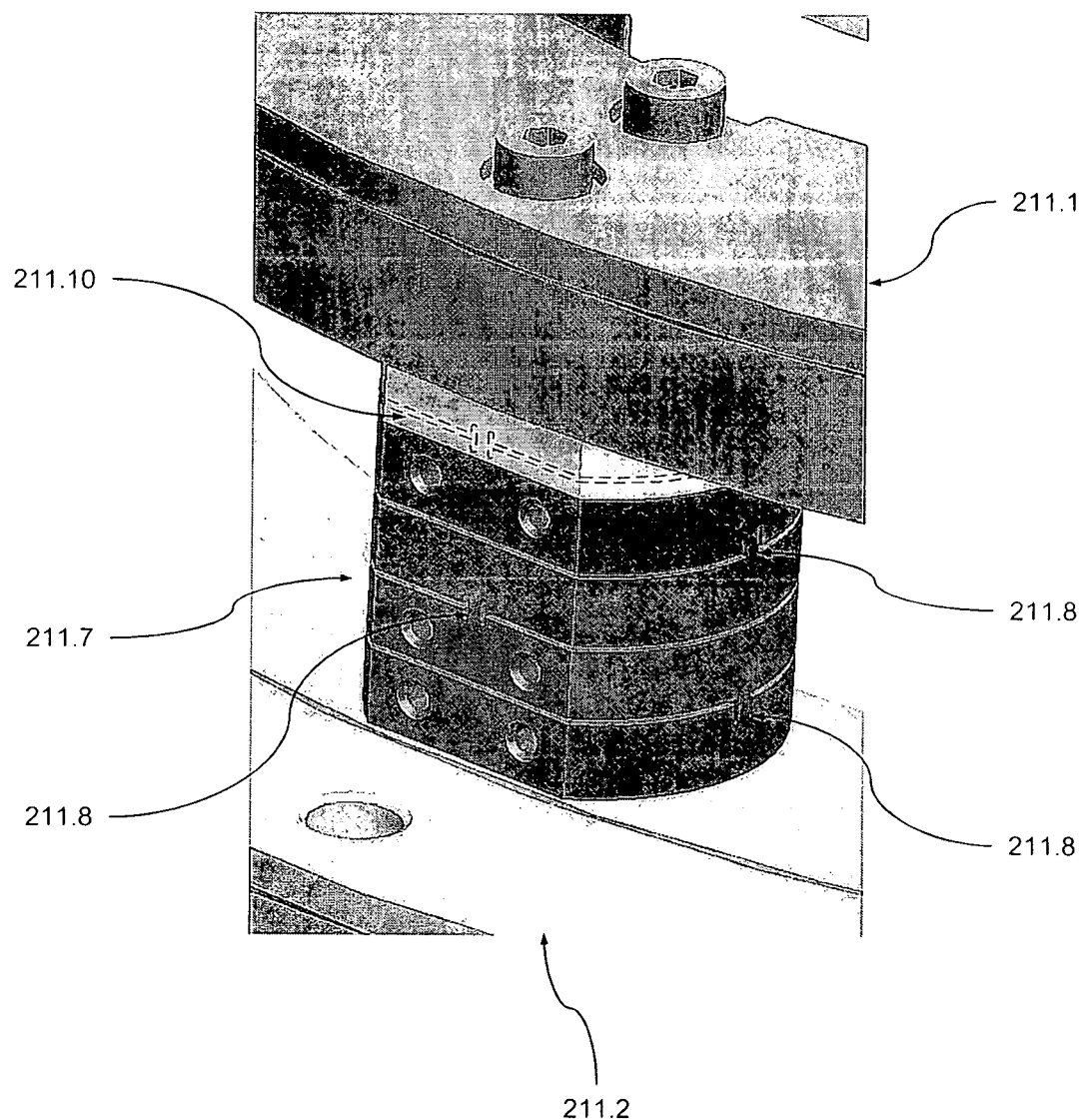
FIG. 6 is a schematic perspective view of detail VI of the optical module of FIG. 3.

With reference to FIGS. 1, 5 and 6 a further preferred embodiment of an optical module 202.1 according to the invention of the illumination device 102 is described below. The optical module 202.1 may be used instead of the optical module 102.1 in the illumination unit 102. The optical module 202.1, in its design and functionality, basically corresponds to the optical module 102.1 such that it is here only referred to the differences. In particular, similar components are given the same reference number raised by the value 100. Unless something different is said in the following, reference is made to the explanations given above in the context of the first embodiment with respect to the features and properties of these components.

The optical module 202.1 again comprises a lens 107. The difference with respect to the optical module 102.1 only lies within the design of the connection of the inner ring 211.1 to the outer ring 211.2 of the retaining device 211. Apart from that the two optical modules 202.1 and 102.1 are identical. In particular, the lens 107 is connected to the inner ring 211.1 in a manner identical to the one of the first embodiment.

The inner ring 211.1 is connected to the outer ring 211.2 via three uncoupling elements 211.7 evenly distributed at its circumference. The uncoupling elements 211.7 serve to avoid, as far as possible, that stresses are introduced from the outer ring 211.2 into the inner ring 211.1 and, via the latter, into the lens 107. Such stresses, among others, may be caused by temperature gradients within the system, different coefficients of thermal expansion, manufacturing inaccuracies of coupling surfaces, coupling forces and coupling moments, respectively, etc.

Each of the uncoupling elements 211.7 restricts two degrees of freedom, namely in the present example the degree of freedom in the direction of the optical axis 107.1 as well as the degree of freedom tangential to the circumferential direction U. By this means a so-called isostatic support of the inner ring 211.1 is achieved. However, it goes without saying that with other variants of the invention other degrees of freedom may be restricted pair wise.

In the present example, the uncoupling elements 211.7 are designed as a separate components connected to the inner ring 211.1. By wire erosion, for example, corresponding cuts are introduced into the body of the uncoupling elements 211.7 via which three corresponding solid body hinges 211.8 are formed, via which the articulated connection of the inner ring 211.1 to the outer ring 211.2 is realised restricting the two degrees of freedom. Depending on the design of the solid body hinges 211.8 shown, a further solid body hinge may be provided to this end as it is indicated by the dashed contour 211.10.

It goes without saying, however, that with other variants of the invention, a monolithic connection between the inner ring and/or the outer ring and the uncoupling element may be provided. It goes as well without saying that, when it are the embodiment of the invention having a greater number of uncoupling elements, an isostatic support may also be achieved with uncoupling elements that, at least in part, restrict only one degree of freedom.

In the present example, the optical module 202.1 is a module of the illumination unit 102 within which, during operation of the imaging device 101, temperature variations of about ±10 K are admissible. With the present design of the optical module according to the invention, even with these comparatively high temperature variations, it is possible to keep the arising stress induced birefringence below 2 nm/cm and, in particular, to limit this to the boundary region of the lens 107.

It goes without saying that the design of the optical module 202.1 outlined above may also be used for an optical module of the objective 104. For example, at least one of the lenses 108 of the objective 104 may be held by the retaining device 211 described above.

Third Embodiment

Figure 7:
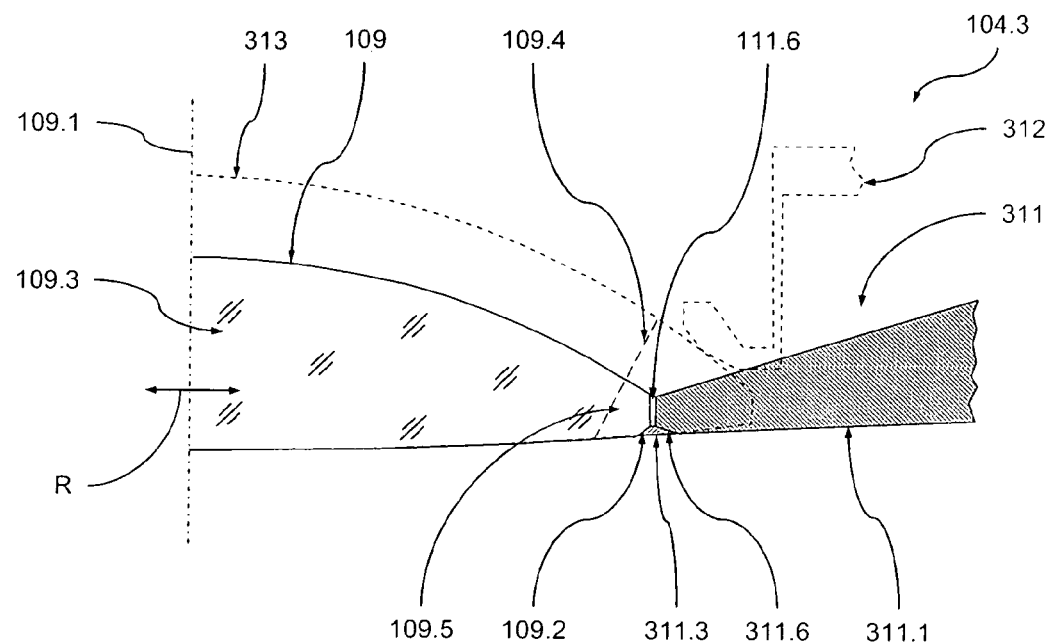
FIG. 7 is a schematic partial section through a further optical module according to the invention of the imaging device from FIG. 1.
Figure 8:
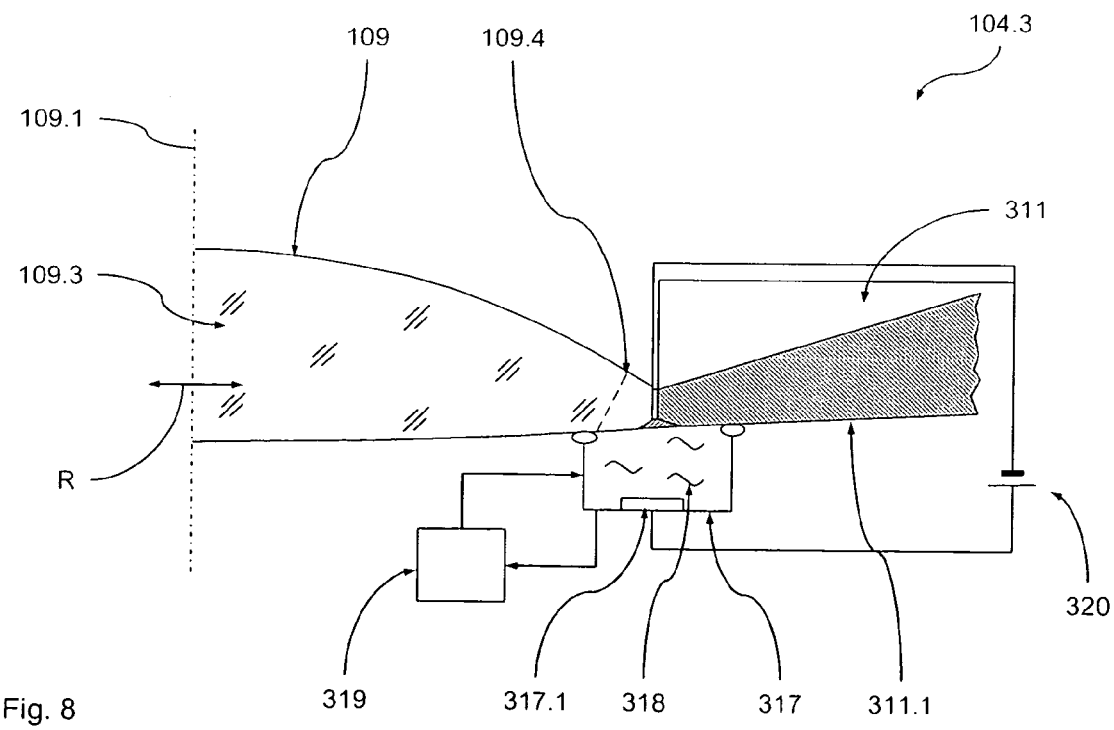
FIG. 8 is a schematic partial section through the optical module from FIG. 4, during its production.

With reference to FIGS. 1, 7 and 8 a further preferred embodiment of an optical module according to the invention 104.3 of the objective 104 is described below.

The optical module 104.3 is a closing module of the objective 104, which is arranged at the end of the objective 104, which during operation is adjacent to the immersion zone 110 and the wafer 105.1. The closing module 104.3 comprises the last lens element 109 as well as a retaining device 311, which holds the last lens element 109.

The retaining device 311 comprises a carrier ring 311.1 reaching up to close to the periphery of the lens 109, such that a narrow gap 316 is formed between the lens 109 and the carrier ring 311.1 and orbiting in the circumferential direction of the lens 109. The gap 316 in this case runs parallel to the optical axis 109.1 of the lens 109 and perpendicularly to the main extension plane of the lens 109, respectively. It goes without saying however that the lens and the carrier ring, with other variants of the invention, can also define any other arbitrary shape and/or alignment of the orbiting gap formed between them.

As can be seen from FIGS. 7 and 8, the carrier ring 311.1 is connected to the lens 109 by means of a contact element 311.3 continuously orbiting in the circumferential direction of the lens 109. The contact element 311.3 in this case contacts a first contact surface 109.2 of the lens 109 as well as a second contact surface 311.6 of the carrier ring 311.1, such that it bridges the gap 316.

The first contact surface 109.2 and the second contact surface 311.6 in each case are inclined with respect to the optical axis 109.1 of the lens 109, wherein they have opposite inclinations with respect to the optical axis 109.1. It goes without saying however that with other variants of the invention, any other suitable alignment of the first and second contact surface in relation to the optical axis of the lens can also be selected.

As can in particular be seen from FIG. 8, the orbiting contact element 311.3 is formed on the first contact surface 109.2 and the second contact surface 311.6 by galvanic deposition. For this purpose the first contact surface 109.2 and the second contact surface 311.6 are initially provided with a corresponding electrically conductive coating by way of a suitable process (for example vapor deposition, sputtering etc.). Subsequently the lens 109 and the carrier ring 311.1 are aligned to each other, so that they have the spatial position between one another desired for the operation of the objective 104.

Subsequently an orbital annular galvanizing channel 317 is sealingly positioned in relation to the lens 109 and the carrier ring 311.1 so that a galvanic medium 318 circulating therein washes around the first contact surface 109.2 and the second contact surface 311.6. If necessary, the gap 316 can be sealed by suitable means—not illustrated in FIG. 8. The supply and circulation of the galvanic medium 318 in this case are provided by a corresponding pump unit 319.

Subsequently the lens 109 and the carrier ring 311.1 are preferably tempered, so that they have a pre-defined temperature distribution, which substantially corresponds to the temperature distribution as is present or to be expected within them during operation of the imaging device 101.

As soon as the pre-defined temperature distribution is reached, the electrically conductive coatings of the first contact area 109.2 and the second contact area 311.6 as well as an orbiting circular anode 317.1 of the galvanizing channel 317 are connected to a power source 220, in order to start the galvanic deposition of the contact element 311.3. This condition is maintained until the contact element 311.3 has formed, hence the lens 109 and the carrier ring 311 become "grown together".

It goes without saying however that with other variants of the invention, it can also be proposed that the contact element is only galvanically deposited on the lens or the carrier ring, respectively, in a form, in which the contact element can then be mechanically connected to the carrier ring or the lens, respectively, in another way.

Tempering the lens 109 and the carrier ring 311.1 with the pre-defined temperature distribution during the making of the contact element 311.3 has the advantage that the contact element 311.3 during operation of the objective 104 reaches a state, which is substantially free from stresses, which could be due to a different thermally induced expansion of the lens 109 and the carrier ring 311. In other words, the contact element 311.3 during operation of the objective 104 again assumes the state free from thermally induced stress of prevailing during its making. Therefore, during operation of the objective 104, advantageously substantially no such stresses, due to different thermal coefficients of expansion of the lens 109 and the carrier ring 311.1, are introduced into the lens 109.

Galvanic application of the contact element 311.3 also has the advantage that an especially even support of the lens 109 is achieved and substantially no stresses due to production tolerances at joining faces arise, which might otherwise be introduced into the lens 109.

As can be seen from FIG. 7, the contact zone between the contact element 311.3 and the lens 109, due to the shearing strength of the contact element 311.3 and the positive fit, ultimately achieved in the direction of the optical axis 109.1, between the lens 109 and the carrier ring 311.1, can prove to be comparatively small.

Therefore a particularly compact lens 109 can also be obtained with this variant of the present invention. This applies in particular compared with the prior art mounting techniques, which are indicated in FIG. 7 by the broken outlines 312 and 313. With the prior art mounting techniques, wherein the contact elements 312 are bonded to an optical surface 313 of the lens, on account of the contacts around the optical surface a large overrun and thus a large lens volume result.

This lens size, reduced in relation to the prior art methods, on the one hand, has the economic advantage as mentioned that less lens material is needed. On the other hand the intrinsic weight of the lens is naturally reduced, with the advantages initially already described as regards the increased resonant frequency of the arrangement consisting of retaining device 311 and lens 109 and the reduced inherent deformation of the lens 109 as well as the advantages resulting therefrom regarding the reduction of imaging errors. In particular it is possible to obtain a favourable resonant frequency of the arrangement consisting of retaining device 311 and lens 109 above 300 Hz.

The optically usable region 109.3 of the lens 109 also here is again defined by the so-called free optical diameter FOD of the lens 109—usually indicated in the data sheet of a lens. The free optical diameter FOD of the lens 109 in turn results from the outermost rays, indicated in FIGS. 7 and 8 by the broken line 109.4, of a light beam still completely passing through the lens 109.

In the present example it is possible as well, owing to the present invention, to limit the overrun 109.5 of the lens 109 to the minimum necessary for production of the lens 109. As already mentioned above, for each lens a certain minimum overrun, in the area of which the lens inter alia must be held during the making of its optical surfaces, is necessary for production. Depending upon production method, nominal diameter and type of the lens, various minimum overruns are necessary. Thus in the case of an aspherical lens with a nominal diameter of approximately 200 mm a minimum overrun, which lies approximately between 10 mm and 12 mm is necessary, while this minimum overrun in the case of a spherical lens of this nominal diameter usually lies approximately between 4 mm and 6 mm.

Therefore, in the present example, with $S=S_{min}$ and with the above equation (2), an overrun ratio $S_{rel}=1$ applies. It goes without saying however that with the other variants of the invention, if necessary, a somewhat larger overrun can also be provided. In any case with the present invention an overrun ratio $S_{rel} \leqq 1.5$ is attainable, normally an overrun ratio $S_{rel} \leqq 1.2$ can be achieved.

In order to reduce, to the greatest extent possible, stresses due to different thermal expansion of the lens 109 and the inner ring 311.1, for the inner ring 311.1 a material is preferably used, whose coefficient of thermal expansion is adapted to the coefficient of thermal expansion of the lens 109. In the present example the lens 109 is made of quartz ($SiO_2$) and the inner ring 311.1 is made of Invar. It goes without saying however that with other variants of the invention other arbitrary materials, correspondingly adapted to one another, can also be used. In particular, for the carrier ring, a material corresponding to the material of the lens may be used, which although having the same coefficient of thermal expansion nevertheless has a lower optical quality and thus is more economical.

It goes without saying here that if an electrically conductive material is used for the carrier ring, the coating of the second contact area 311.6 of the carrier ring 311.1, described above, can also be dispensed with.

Furthermore it goes without saying that during the times when the lens 109 and/or the carrier ring 311.1 are in contact with the galvanic medium 318, the corresponding surfaces impinged by the galvanic medium 318, lying outside the respective contact area 109.2 or 311.6, can be provided with a corresponding protective coating, if necessary to be removed later.

In addition it goes without saying that with other variants in the invention, the use of a circular channel is not absolutely essential. Rather the entire arrangement consisting of lens and carrier ring can be immersed in a corresponding galvanic bath.

A further advantage of the present example with the orbiting contact element 311.3 lies in the sealing of the gap 316, which is obtained as a result. No extra cost is necessary for such a sealing, so that during operation of the objective 104 ingress of the immersion medium from the immersion zone 110 into the interior of the objective 104 through the gap 316 is reliably prevented.

Here it is also of advantage that the galvanically deposited metallic material of the contact element 311.3, differently than polymer sealants or the like normally used, does not cause any negative effects such as swelling, shrinking, ageing or outgassing of substances polluting the atmosphere in the interior of the objective 104.

Finally it is of advantage that the contact element 311.3 integrates the sealing and retaining functions over the smallest space, so that with the invention a particularly compact and light configuration is possible, which is again of advantage not least under the criterion of high resonant frequency.

It goes without saying here however that with other variants of the invention, provision can also be made for a plurality of separate contact elements to be galvanically deposited on the periphery of the optical element. This can be the case especially with optical elements, which are arranged in the interior of the objective 104 and where no special requirements regarding sealing of the gap to the carrier ring are imposed.

The carrier ring 311.1 can be directly connected to the housing 104.2 of the lens or can be a component of this housing, respectively. Likewise the carrier ring 311.1 here in addition can be connected to an outer ring, similarly to the outer ring 111.2 from FIGS. 2 and 3. This connection in turn can be formed by uncoupling elements, as described above in connection with the uncoupling elements 111.7.

It goes without saying however that the configuration of the optical module 104.3, just described, can equally also be used for an optical module of the illumination system 102. For example at least one of the lenses 107 of the illumination system 102 can be held by the retaining device 311 described above.

Fourth Embodiment

Figure 9:
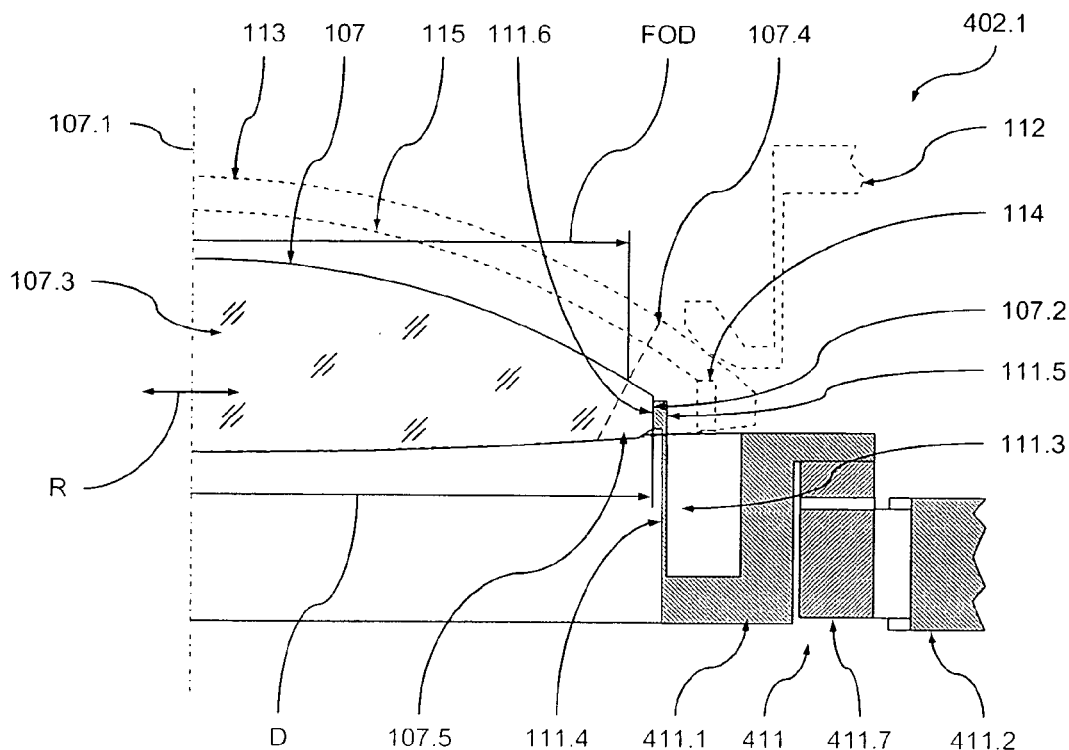
FIG. 9 is a schematic partial section through a further optical module according to the invention for the imaging device from FIG. 1.
Figure 10:
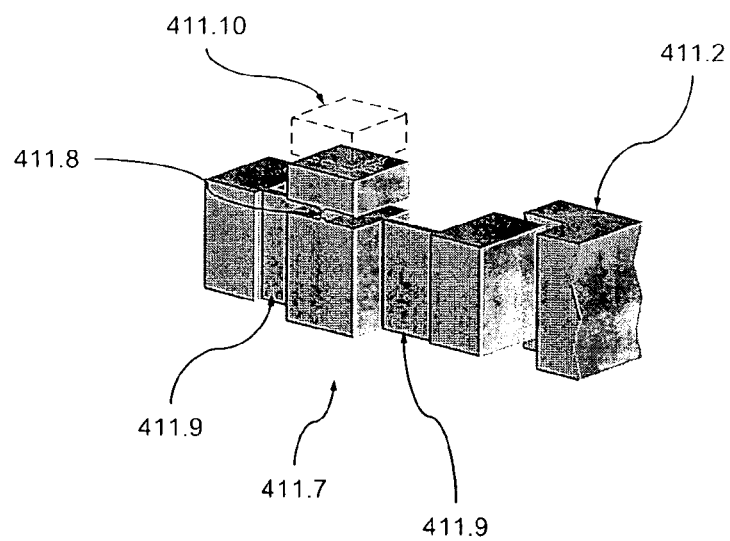
FIG. 10 is a schematic perspective view of a detail of the optical module of FIG. 9.

With reference to FIGS. 1, 9 and 10 a further preferred embodiment of an optical module 402.1 according to the invention of the illumination device 102 is described below. The optical module 402.1 may be used instead of the optical module 102.1 in the illumination unit 102. The optical module 402.1, in its design and functionality, basically corresponds to the optical module 102.1 such that it is here only referred to the differences. In particular, similar components are given the same reference number raised by the value 300. Unless something different is said in the following, reference is made to the explanations given above in the context of the first embodiment with respect to the features and properties of these components.

The optical module 402.1 again comprises a lens 107. The difference with respect to the optical module 102.1 only lies within the design of the connection of the inner ring 411.1 to the outer ring 411.2 of the retaining device 411. Apart from that, the two optical modules 402.1 and 102.1 are identical. In particular, the lens 107 is connected to the inner ring 411.1 in a manner identical to the one of the first embodiment.

The inner ring 411.1 is connected to the outer ring 411.2 via three uncoupling elements 411.7 evenly distributed at its circumference. The uncoupling elements 411.7 again serve to avoid, as far as possible, that stresses are introduced from the outer ring 411.2 into the inner ring 411.1 and, via the latter, into the lens 107. Such stresses, among others, may be caused by temperature gradients within the system, different coefficients of thermal expansion, manufacturing inaccuracies of coupling surfaces, coupling forces and coupling moments, respectively, etc.

Each of the uncoupling elements 411.7 restricts two degrees of freedom, namely in the present example the degree of freedom in the direction of the optical axis 107.1 as well as the degree of freedom tangential to the circumferential direction U. By this means a so-called isostatic support of the inner ring 411.1 is achieved. However, it goes without saying that with other variants of the invention other degrees of freedom may be restricted pair wise.

In the present example, the uncoupling elements 411.7 are designed as a separate components connected to the inner ring 411.1. Within the body of the uncoupling elements 411.7 (e.g. by wire erosion) a solid body hinge 411.8 and two leaf spring elements 411.9 are formed, via which the articulated connection of the inner ring 411.1 to the outer ring 411.2 is realised restricting the two degrees of freedom. Depending on the design of the solid body hinge 411.8 and the leaf spring elements 411.9, a further solid body hinge may be provided to this end as it is indicated by the dashed contour 411.10 in FIG. 10.

It goes without saying, however, that, with other variants of the invention, a monolithic connection between the inner ring and/or the outer ring and the uncoupling element may be provided. It goes as well without saying that, when it are the embodiment of the invention having a greater number of uncoupling elements, an isostatic support may also be achieved with uncoupling elements that, at least in part, restrict only one degree of freedom.

In the present example, the optical module 402.1 is a module of the illumination unit 102 within which, during operation of the imaging device 101, temperature variations of about ±10 K are admissible. With the present design of the optical module according to the invention, even with these comparatively high temperature variations, it is possible to keep the arising stress induced birefringence below 2 nm/cm and, in particular, to limit this to the boundary region of the lens 107.

It goes without saying that the design of the optical module 402.1 outlined above may also be used for an optical module of the objective 104. For example, at least one of the lenses 108 of the objective 104 may be held by the retaining device 411 described above.

Fifth Embodiment

Figure 11:
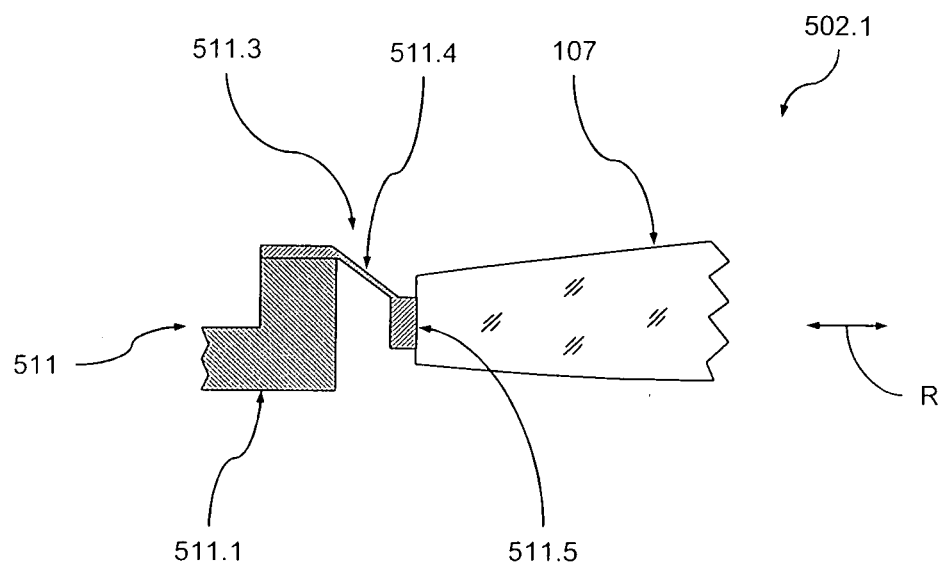
FIG. 11 is a schematic partial section through a further optical module according to the invention for the imaging device from FIG. 1.

With reference to FIGS. 1 and 11 a further preferred embodiment of an optical module 502.1 according to the invention of the illumination device 102 is described below. The optical module 502.1 may be used instead of the optical module 102.1 in the illumination unit 102. The optical module 502.1, in its design and functionality, basically corresponds to the optical module 102.1 such that it is here only referred to the differences. In particular, similar components are given the same reference number raised by the value 400. Unless something different is said in the following, reference is made to the explanations given above in the context of the first embodiment with respect to the features and properties of these components.

The optical module 502.1 again comprises a lens 107. The difference with respect to the optical module 102.1 only lies within the design of the connection of the lens 107 to the inner ring 511.1 of the retaining device 511. Apart from that, the two optical modules 502.1 and 102.1 are identical. In particular, the inner ring 511.1 is connected to the associated outer ring 111.2 (not shown) in a manner identical to the one of the first embodiment.

As can be seen from FIG. 11, the inner ring 511.1 is connected to the lens 107 via a plurality of contact elements. The contact elements 511.3 are designed as leaf spring elements which are narrow in the circumferential direction U of the lens 107 and which comprise an elongated spring section 511.4. Such contact elements are known for example from U.S. Pat. No. 6,825,998 B2 (Yoshida), the entire disclosure of which is incorporated herein by reference.

In the present example, the contact elements 511.3 are connected to each other in a monolithic manner and are connected, via suitable means, to the inner ring 511.1. It goes without saying, however, that, with other variants of the invention, it may also be provided that the contact elements are formed, altogether, combined in groups or individually, as a separate component which is connected (eventually monolithically) to the inner ring.

The contact elements 511.3 are arranged in a manner inclined with respect to the optical axis 107.1 of the lens 107 and with respect to the main extension plane of the lens 107, respectively. The spring section 511.4 consequently defines a bending axis which is arranged substantially tangentially to the circumferential direction U of the lens 107.

The contact elements 511.3, at their end facing the lens 107, comprise a contact head 511.5 contacting a first contact surface 107.2 of the lens 107 with a second contact surface. The first contact surface 107.2 runs perpendicularly to the main extension plane of the lens 107 and, thus, parallel to the optical axis 107.1. Hence, the first contact surface 107.2 is located at the so-called cylinder of the lens 107.

In the present example, the first contact surface 107.2 extends over the entire circumference of the lens 107. However, it goes without saying that, with other variants of the invention, it may also be provided that the first contact surface is only provided in one or more sections of the circumference of the lens.

The contact heads 511.5 are adhesively bonded to the lens by a suitable adhesive. However, it goes without saying that, with other variants of the invention, it may also be provided that an arbitrary other connection may be selected between the contact head and the lens providing a corresponding adhesion force.

The number of the contact elements 511.3 again is selected such that the contact zone of the contact elements 511.3 with the lens 107 in total extends over about 25% of the circumference of the lens 107, hence more than 20% of the circumference of the lens 107. Eventually, it may even extend over an arbitrary larger fraction of the circumference of the lens. Via the orientation of the contact elements 511.3, in particular via the orientation of the bending axis of the spring sections 511.4, it is possible on the one hand to provide, at sufficient rigidity in the other directions in space, a connection of the lens 107 to the retaining device 511 that is especially compliant in the radial direction R and thus is advantageous.

Thanks to the comparatively large number of contact elements 511.3 and the large contact zone achieved in total and the coverage of the lens circumference or the first contact surface 107.2 in the circumferential direction U, respectively, it is hereby possible to keep the dimension of the contact heads 511.5 in the direction of the optical axis 107.1 small, providing the advantages outlined above in the context of the first embodiment.

Sixth Embodiment

Figure 12:
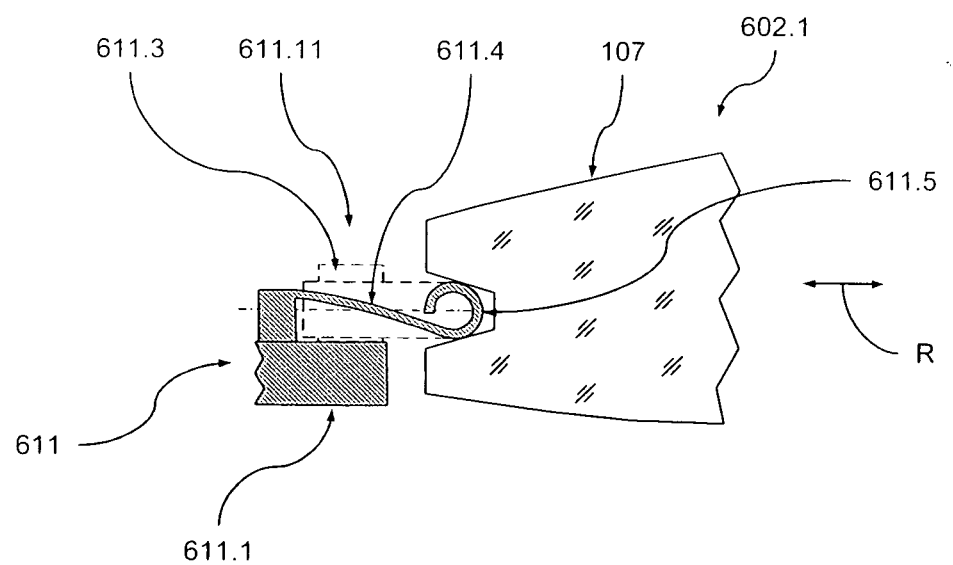
FIG. 12 is a schematic partial section through a further optical module according to the invention for the imaging device from FIG. 1.

With reference to FIGS. 1 and 12 a further preferred embodiment of an optical module 602.1 according to the invention of the illumination device 102 is described below. The optical module 602.1 may be used instead of the optical module 102.1 in the illumination unit 102. The optical module 602.1, in its design and functionality, basically corresponds to the optical module 102.1 such that it is here only referred to the differences. In particular, similar components are given the same reference number raised by the value 500. Unless something different is said in the following, reference is made to the explanations given above in the context of the first embodiment with respect to the features and properties of these components.

The optical module 602.1 again comprises a lens 107. The difference with respect to the optical module 102.1 only lies within the design of the connection of the lens 107 to the inner ring 611.1 of the retaining device 611. Apart from that, the two optical modules 602.1 and 102.1 are identical. In particular, the inner ring 611.1 is connected to the associated outer ring 111.2 (not shown) in a manner identical to the one of the first embodiment.

As can be seen from FIG. 11, the inner ring 611.1 is connected to the lens 107 via a plurality of contact elements. The contact elements 611.3 are designed as leaf spring elements which are narrow in the circumferential direction U of the lens 107 and which comprise an elongated spring section 611.4. Such contact elements are known for example from U.S. Pat. No. 7,006,308 B2 (Sudoh), the entire disclosure of which is incorporated herein by reference.

In the present example, the contact elements 611.3 are designed as separate components and are connected, via suitable means, to the inner ring 611.1. It goes without saying, however, that, with other variants of the invention, it may also be provided that the contact elements are formed, altogether, combined in groups or individually, as a separate component which is connected (eventually monolithically) to the inner ring.

The contact elements 611.3, in their mounted state, are arranged in a manner slightly inclined with respect to the optical axis 107.1 of the lens 107 and with respect to the main extension plane of the lens 107, respectively. The spring section 611.4 consequently defines a bending axis which is arranged substantially tangentially to the circumferential direction U of the lens 107.

The contact elements 611.3, at their end facing the lens 107, comprise a contact head 611.5 reaching into an orbiting groove of the lens 107. Eventually, the lens 107 may be locked by three or more adjustable locking elements as it is indicated by the dashed contour 611.11.

The number of the contact elements 611.3 again is selected such that the contact zone of the contact elements 611.3 with the lens 107 in total extends over about 25% of the circumference of the lens 107, hence more than 20% of the circumference of the lens 107. Eventually, it may even extend over an arbitrary larger fraction of the circumference of the lens.

Thanks to the comparatively large number of contact elements 611.3 and the large contact zone achieved in total and the coverage of the lens circumference or the first contact surface 107.2 in the circumferential direction U, respectively, it is hereby possible to keep the dimension of the contact heads 611.5 in the direction of the optical axis 107.1 small, providing the advantages outlined above in the context of the first embodiment.

The present invention has been described above on the basis of examples, wherein refractive, optical elements were used exclusively. It is however remarked here that the invention can naturally also find application, in particular for imaging with other wavelengths, in conjunction with optical groups of elements, which comprise, alone or in any arbitrary combination, refractive, reflective or diffractive optical elements.

Furthermore it is to be remarked that the present invention has been described above on the basis of an example from the field of microlithography. It goes without saying however that the present invention can equally also be used for any other arbitrary applications or imaging methods.

The invention claimed is:

1. An optical module, comprising:
    an optical element and
    a retaining device to hold the optical element, wherein
    the optical element has a main extension plane, in which it defines a radial direction R and a circumferential direction U,
    the optical element in the region of its periphery has a contact surface,
    the retaining device has a plurality of contact elements, which are designed to be resilient and contact the optical element in the region of the contact surface,
    at least one of the contact elements has a spring section, which is formed in the manner of a leaf spring,
    the spring section has a bending axis, which runs substantially tangentially to the circumferential direction U,
    the retaining device has an annular retaining element extending in the circumferential direction U,
    the contact elements are connected monolithically to the annular retaining element;
    the retaining device has an annular retaining structure extending in the circumferential direction U,
    the annular retaining element is connected by at least one uncoupling element to the annular retaining structure at a location,
    at the location, the uncoupling element restricts at most two degrees of freedom,
    the optical module is configured to be used in microlithography, and
    the at least one uncoupling element restricts the degree of freedom perpendicular to the main extension plane of the optical element and the degree of freedom tangential to the circumferential direction U.

2. The optical module according to claim 1, wherein the retaining device has more than three contact elements.

3. The optical module according to claim 2, wherein the number and/or configuration of the contact elements is selected in such a manner that the contact zone, in which the contact elements contact the optical element, in total covers at least 20% of the outer periphery of the optical element.

4. The optical module according to claim 1, wherein the contact surface substantially extends over the entire circumference of the optical element.

5. The optical module according to claim 1, wherein the contact surface extends substantially perpendicularly to the main extension plane of the optical element.

6. The optical module according to claim 1, wherein the annular retaining element has a coefficient of thermal expansion, which is adapted to the coefficient of thermal expansion of the optical element, substantially corresponds to the coefficient of thermal expansion of the optical element.

7. The optical module according to claim 1, wherein
    the annular retaining element is made of Invar and the optical element is made of a quartz material ($SiO_2$), or the annular retaining element is made of stainless steel or brass and the optical element is made of a calcium fluoride ($CaF_2$).

8. The optical module according to claim 1, wherein
    the contact elements are designed to be resilient in the radial direction R, wherein
    the leaf spring is resilient in the radial direction R.

9. The optical module according to claim 1, wherein
    the annular retaining element is connected by three uncoupling elements to the annular retaining structure, which are distributed on the periphery of the annular retaining element, wherein
    each uncoupling element restricts the degree of freedom perpendicular to the main extension plane of the optical element and the degree of freedom tangential to the circumferential direction U.

10. The optical module according to claim 9, wherein the three uncoupling elements are evenly distributed on the periphery of the annular retaining element.

11. The optical module according to claim 1, wherein the uncoupling element is connected monolithically to the annular retaining structure and/or the annular retaining element.

12. The optical module according to claim 1, wherein
    the optical element has a free optical diameter and an overrun in the region of its outer periphery and
    the retaining device contacts the optical element in the region of the overrun, wherein
    the overrun ratio calculated from the overrun related to a minimum overrun necessary for the production of the optical element, is at most 1.5.

13. The optical module according to claim 1, wherein at least a part of the contact elements is adhesively bonded to the optical element.

14. A method for holding an optical element for microlithography, the method comprising:
    holding the optical element using a retaining device, wherein
    the optical element has a main extension plane, in which it defines a radial direction R and a circumferential direction U,
    the optical element, in the region of its periphery, is held in a manner resilient in the radial direction R on a retaining element via a plurality of contact elements contacting the optical element,
    wherein
    the retaining element is held on a retaining structure by an uncoupling element at a location,
    at the location, the uncoupling element restricts at most two degrees of freedom, and
    the at least one uncoupling element restricts the degree of freedom perpendicular to the main extension plane of the optical element and the degree of freedom tangential to the circumferential direction U.

15. The method according to claim 14, wherein
    the optical element is held by means of more than three contact elements, wherein
    the number and/or configuration of the contact elements is selected in such a manner that the contact zone, in which the contact elements contact the optical element, in total covers at least 30% of the outer periphery of the optical element.

* * * * *

UNITED STATES PATENT AND TRADEMARK OFFICE
CERTIFICATE OF CORRECTION

PATENT NO. : 8,441,747 B2  
APPLICATION NO. : 11/901130  
DATED : May 14, 2013  
INVENTOR(S) : Heintel Page 1 of 1

It is certified that error appears in the above-identified patent and that said Letters Patent is hereby corrected as shown below:

In the Claims

Column 17, Line 62, Claim 7, delete "(SiO2),or" insert -- (SiO2), or --.

Signed and Sealed this  
First Day of October, 2013

Teresa Stanek Rea  
*Deputy Director of the United States Patent and Trademark Office*